(12) United States Patent  (10) Patent No.: US 8,886,697 B2
Dolinsky  (45) Date of Patent: Nov. 11, 2014

(54) SOLID STATE PHOTOMULTIPLIER WITH IMPROVED PULSE SHAPE READOUT

(71) Applicant: General Electric Company, Schenectady, NY (US)

(72) Inventor: Sergei Ivanovich Dolinsky, Clifton Park, NY (US)

(73) Assignee: General Electric Company, Niskayuna, NY (US)

( * ) Notice: Subject to any disclaimer, the term of this patent is extended or adjusted under 35 U.S.C. 154(b) by 146 days.

(21) Appl. No.: 13/729,761

(22) Filed: Dec. 28, 2012

(65) Prior Publication Data

US 2014/0183339 A1 Jul. 3, 2014

(51) Int. Cl.
*G06E 3/00* (2006.01)
*H01L 27/144* (2006.01)

(52) U.S. Cl.
CPC .................................. *H01L 27/144* (2013.01)
USPC .................................................. 708/839

(58) Field of Classification Search
CPC ................................ E21B 47/532; G01V 8/02
USPC .............. 250/338.1–338.5; 708/839; 313/532
See application file for complete search history.

(56) References Cited

U.S. PATENT DOCUMENTS

| | | | |
|---|---|---|---|
| 3,697,703 A | 10/1972 | Clark et al. | |
| 5,457,310 A | 10/1995 | Fournier | |
| 5,684,769 A | 11/1997 | Kaneko | |
| 7,577,364 B2 | 8/2009 | Edwards et al. | |
| 7,620,082 B2 | 11/2009 | Van | |
| 7,723,694 B2 | 5/2010 | Frach et al. | |
| 7,818,047 B2 | 10/2010 | Tumer et al. | |
| 7,947,954 B2 | 5/2011 | Snider et al. | |
| 8,729,654 B2 * | 5/2014 | Choong et al. | 257/437 |
| 2011/0108702 A1 | 5/2011 | Jackson et al. | |

FOREIGN PATENT DOCUMENTS

WO 2012007734 A2 1/2012

OTHER PUBLICATIONS

Stapels et al., "Solid-state photomultiplier in CMOS technology for gamma-ray detection and imaging applications," 2005, IEEE Nuclear Science Symposium Conference Record, pp. 2775-2779.*
Eidelman et al., "Particle Detectors", Physics Letters-PDG (Particle Data Group), vol. 592, Issue 1, May 31, 2006.
Rolo et al, "A Low-Noise CMOS Amplifier for Medical Imaging", Departamento De Electrónica, Telecomunicações E Informática, Universidade De Aveiro , pp. 1-128, 2010.
Dolinsky, Novel approach for calibration breakdown voltage of large area SiPM', International Workshop on New Photon-detectors, Jun. 13-15, 2012.

* cited by examiner

*Primary Examiner* — Kiho Kim
(74) *Attorney, Agent, or Firm* — Robert M. McCarthy (57) ABSTRACT

Exemplary embodiments are directed to shaping a readout pulse from a solid state photomultiplier (SSPM). A readout pulse can be received from the SSPM at an input of a buffer amplifier. The readout pulse can have a discharge portion with a discharge rate and a recharge portion with a recharge rate. A magnitude of the readout pulse increasing for the discharge portion and decreasing for the recharge portion. A frequency dependent input impedance circuit can be employed in electrical communication with the input of the buffer amplifier to shape the discharge portion of the readout pulse.

20 Claims, 6 Drawing Sheets

SOLID STATE PHOTOMULTIPLIER WITH IMPROVED PULSE SHAPE READOUT

BACKGROUND

Solid state photomultipliers (SSPMs), which are also commonly referred to as MicroPixel Photon Counters (MPPC) or MicroPixel Avalanche Photodiodes (MAPD) have become popular for use as photosensors. For example, SSPMs have been employed in scintillator based nuclear detectors. Typically, SSPMs are implemented as Silicon Photomultipliers (SiPM). The Silicon Photomultiplier (SiPM) is multipixel (multi-SPAD) silicon photodiode with a number up to a few thousand independent micropixels (with typical size of 10-100 microns) joined together on common substrate and working on common load. Each pixel detects the photoelectrons with a gain of about $10^6$.

Conventionally, the output of an SSPM is connected to a front end buffer amplifier, which can be implemented as a transimpedance amplifier. Using this conventional arrangement can result in a readout pulse from the SSPM that has a fast rise time (e.g., <1 ns) and a relatively slow fall time (e.g., 10-50 ns). When an SSPM is used as a photosensor in a nuclear detector, this pulse shape can convolute with the scintillator decay time and produce a signal with a slow rise time. Attempting to shape the readout pulse after the pulse is output by the buffer amplifier can attenuate the pulse and/or degrade the signal-to-noise ratio.

SUMMARY

Exemplary embodiments of the present disclosure are directed shaping a readout pulse from a solid state photomultiplier (SSPM) using a frequency dependent input impedance circuit in electrical communication with the input of a buffer amplifier.

In one embodiment, a SSPM-based detector is disclosed. The detector can include a solid state photomultiplier (SSPM) having a plurality of microcells. The SSPM is configured to output a readout pulse in response to photons impinging on one or more of the microcells. The readout pulse has a discharge portion with a discharge rate and a recharge portion with a recharge rate. A magnitude of the readout pulse is increasing for the discharge portion and decreasing for the recharge portion. The detector further includes a buffer amplifier having an input in electrical communication with an output of the SSPM to receive the readout pulse and a frequency dependent input impedance circuit in electrical communication with the input of the buffer amplifier to shape the discharge portion of the readout pulse.

In another embodiment, a method of shaping a readout pulse from a solid state photomultiplier is disclosed. The method includes receiving the readout pulse from the SSPM at an input of a buffer amplifier. The readout pulse has a discharge portion with a discharge rate and a recharge portion with a recharge rate. A magnitude of the readout pulse increases for the discharge portion and decreases for the recharge portion. The method also includes employing a frequency dependent input impedance circuit in electrical communication with the input of the buffer amplifier to shape the discharge portion of the readout pulse.

In some embodiments, the impedance of the input impedance circuit can be responsive to the discharge rate and the recharge rate of the readout pulse to provide greater impedance during discharge portion of the readout pulse than the recharge portion of the readout pulse. The impedance of the frequency dependent input impedance circuit can decrease with a decrease in frequency in the readout pulse.

In some embodiments, the recharge rate can be substantially unaffected by the frequency dependent input impedance circuit.

In some embodiments, the frequency dependent input impedance circuit can include an inductor connected between an output of the SSPM and an input of the buffer amplifier. The frequency dependent input impedance circuit can also include a resistor connected in series with the inductor. A value of the inductor can be specified to shape the recharge portion of the readout pulse so that a recharge time associated with the recharge portion and a discharge time associated with the discharge portion are substantially equivalent.

In some embodiments, the frequency dependent input impedance circuit can be a pole-zero cancellation circuit connected between an output of the SSPM and an input of the buffer amplifier. The pole-zero cancellation circuit can include a capacitor and a resistor connected between an output of the SSPM and an input of the buffer amplifier in parallel to each other. A value of the capacitor and a value of the resistor can be specified to shape the recharge portion of the readout pulse so that a recharge time associated with the recharge portion and a discharge time associated with a discharge portion are substantially equivalent.

Any combination or permutation of embodiments is envisioned. Other objects and features will become apparent from the following detailed description considered in conjunction with the accompanying drawings. It is to be understood, however, that the drawings are designed as an illustration only and not as a definition of the limits of the invention.

DESCRIPTION OF EXEMPLARY EMBODIMENTS

Exemplary embodiments of the present disclosure are directed to shaping a readout pulse from a solid state photomultiplier (SSPM). A readout pulse can be received from the SSPM at an input of a buffer amplifier. The readout pulse can have a discharge portion with a discharge rate and a recharge portion with a recharge rate. A magnitude of the readout pulse is increasing for the discharge portion and decreasing for the recharge portion. A frequency dependent input impedance circuit can be employed in electrical communication with the input of the buffer amplifier to shape the discharge portion of the readout pulse.

Figure 1:
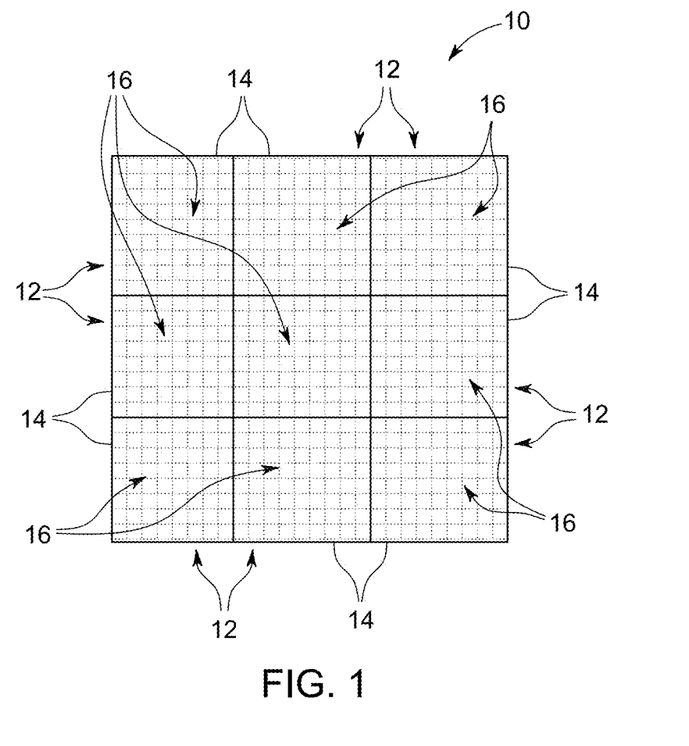
FIG. 1 illustrates a portion of an exemplary SSPM array 10 in accordance with exemplary embodiments of the present disclosure.

FIG. 1 illustrates a portion of an exemplary SSPM array 10 (e.g., an SiPM) in accordance with exemplary embodiments of the present disclosure. The array 10 can include pixel areas 12 and each pixel area 12 can include an SSPM 14. Each SSPM 14 can be formed of an array of microcells 16. The microcells 16 that form the SSPMs 14 can be implemented as a two dimensional array having a specified dimension, e.g., from about 10 to about 100 microns, and a specified spatial density, e.g., about 100 to about 1000/sq. mm. In some embodiments, the SSPM array 10 can be incorporated into a high energy detector, such as a scintillator-based detector or can be used for detecting single photons.

Figure 2:
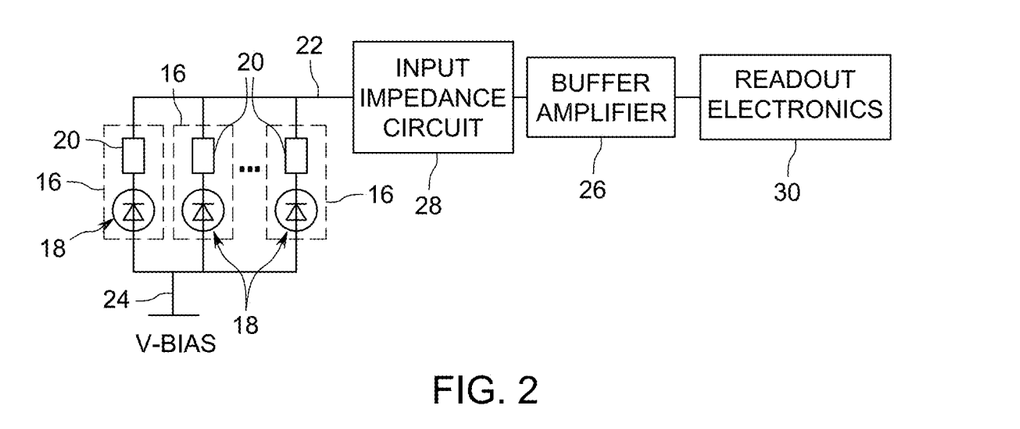
FIG. 2 illustrates a block diagram of an exemplary embodiment of an SSPM-based detector in accordance with the present disclosure.

FIG. 2 illustrates an exemplary embodiment of a detector including one or more of the SSPMs 14 of FIG. 1. The detector can be implemented in a nuclear detector (e.g., X-ray imaging system) and/or an optical detector (e.g., a light detector). Each microcell 16 of the SSPM 14 can be formed by a Geiger-mode avalanche photodiode (APD) 18 and a quenching element 20. In exemplary embodiments, the APDs 16 of the microcells 16 can be formed using one or more semiconductor materials, such as Silicon (Si), Germanium (Ge), Indium Gallium Arsenide (InGaAs), Gallium nitride, Mercury Cadmium Telluride (HgCdTe), and/or any other suitable material(s). In one embodiment, the array of microcells 16 can be formed on a single semiconductor substrate to form the SSPM 14.

Each APD 18 in the microcells 16 can have a breakdown voltage of, for example, about 20 to about 2000 Volts and a bias voltage 24 can be applied to the microcells 16 to configure the APDs 18 in a reverse bias mode having an over voltage (i.e., the difference between the bias voltage and the breakdown voltage). The reverse biased APDs 18 can have an internal current gain of about 100 to about 1000 resulting from an avalanche effect within the APDs at bias voltage below breakdown. When they operate in Geiger mode, the gain of each microcell 16 is proportional to the over voltage and capacitance of micro-cell.

The quenching element 20 in each microcell 16 can be disposed in series between the bias voltage and the APD 18 and can operate to ensure that the APD 18 transitions to the quiescent state after a photon is detected. In exemplary embodiments, the quenching element can be a resistor, transistor, current controlled source, and/or any suitable device or devices for transitioning the APD 18 to the quiescent state after the APD 18 detects of a photon. The microcells 16 are connected to each other in parallel and share a common bias voltage and a common ground. The output of each microcell 16 is used to generate an output 22 of the SSPM 14, which can be processed by readout electronics.

The output of the microcells 16 can output from the SSPM 14 a single cumulative signal, which can be processed via a buffer amplifier 26. The output 22 of the SSPM 14 can take the form of one or more electrical pulses ("readout pulses"). The readout pulses can have an associated discharge time for which a magnitude of the readout pulse increases and an associated recharge time for which the magnitude of the readout pulse decreases.

A rate at which the magnitude decreases during the recharge time (i.e., a recharge rate) can generally be determined by a capacitance associated with the APDs 18 of the SSPM and the impedance of the quenching elements 20. For example, when the quenching elements are resistors, the rate can be defined by the RC time constant formed by the capacitance of the APDs 18 and the resistance of the quenching resistors. In conventional readout configurations of SSPMs. the time constant can cause the recharge portion of the readout pulse to have a long tail (e.g., about 10-50 ns).

The buffer amplifier 26 can have a generally fixed gain component. In exemplary embodiments, the buffer amplifier can be implemented as a transimpedance amplifier. The buffer amplifier can amplify a voltage in the input impedance circuit generated by output signals of the APDs 18 upon detection of one or more photons. The buffer amplifier can output the amplified signal to readout electronics 30 downstream of the buffer amplifier 26 for further processing by the readout electronics 30, which can include amplifiers, analog-to-digital converters, and/or any other suitable electronics. In one exemplary embodiment, the buffer amplifier 26 can be implemented using an off-the-shelf integrate circuit, such as the THS4303 from Texas Instruments.

To compensate for the slow decay associated with recharge rate, in some embodiments, a frequency dependent input impedance circuit 28 can be disposed between the output of the SSPM 14 and the input of the buffer amplifier 26 to provide a frequency dependent impedance in accordance with exemplary embodiments of the present disclosure. In some embodiments, the frequency dependent input impedance circuit 28 can be part of buffer amplifier 26. The input impedance circuit 28 can be configured to shape the recharge portion of the readout pulse. For example, the input impedance circuit 28 can be used to control a voltage received at the input of the buffer amplifier 26 to minimize the amplification of the recharge portion of a readout pulse from the SSPM 14. In one exemplary embodiment, an impedance of the input impedance circuit can be greater for the discharge portion than the recharge portion of the readout pulse such that a voltage at the input of the buffer amplifier 26 can be manipulated for the readout pulse. For example, the frequency response of the impedance circuit 28 can be specified so that the recharge time is substantially equal to a duration of the discharge time. By implementing the frequency dependent input impedance circuit 28 that provides a lower impedance for the recharge portion of the readout pulse and a larger impedance for the recharge portion of the readout pulse, exemplary embodiments of the present disclosure can control the shape of the readout pulse input to the buffer amplifier 26 so that the discharge portion of the pulse is substantially unaffected by the input impedance circuit 28 and the recharge portion of the readout pulse is shaped to compensate for the tail-off in the readout pulse caused by the time constant associated with recharging the APDs 18 of the microcells 16 after one or more photons are detected.

Figure 3:
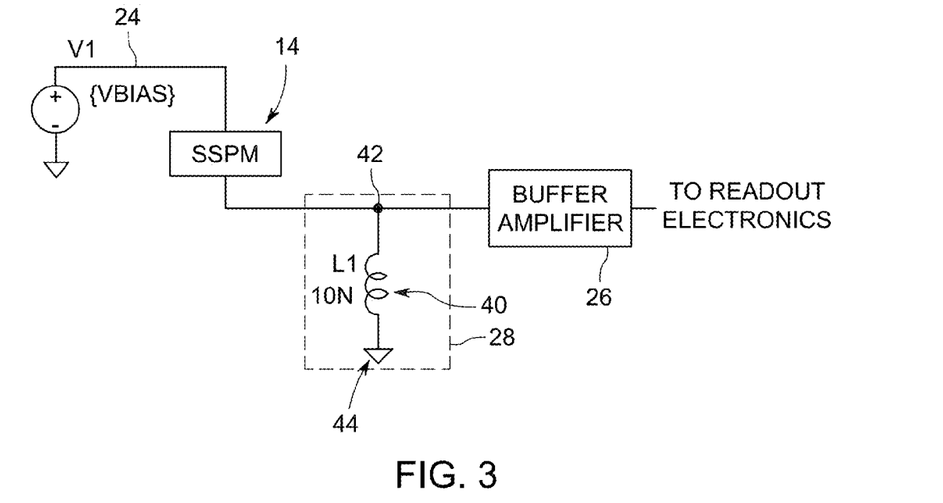
FIG. 3 is a simplified circuit schematic illustrating an exemplary embodiment of an SSPM-based detector in accordance with the present disclosure.

FIG. 3 shows an equivalent circuit for an SSPM-detector including an embodiment of the frequency dependent input impedance circuit 28. The SSPM 14 is modeled as an array of photodiodes with quenching resistors, as described with reference to FIG. 2. As shown in FIG. 3, the frequency dependent input impedance circuit 28 is formed by an inductor 40 connected between the output of the SSPM 14 and the input of the buffer amplifier 26. While the present embodiment illustrate the impedance circuit 28 as being separate from the buffer amplifier, those skilled in the art will recognize that the input impedance circuit 28 can be part of buffer amplifier 26. The inductor 40 is arranged in a shunt configuration such that one terminal of the inductor is connected to the input of the buffer amplifier 26 and the other terminal of the inductor is connected to ground to form an input impedance to the buffer amplifier 26.

In an exemplary operation, when one of more of the microcells 16 detect a photon event, the microcell diodes 18 discharge as a result of the avalanche effect in the microcells 16 and subsequently are recharged in a controlled manner due to the quenching element of the microcells 20. As a result, a readout pulse is generated at the output of the SSPM 14, which can be a single cumulative signal. During the discharge portion of the readout pulse, the magnitude of the readout pulse increases rapidly (e.g., in less than approximately 1 ns) based on the discharge rate of the microcells 16. Since the discharge rate of the microcells 16 discharge is generally high, the impedance of the inductor 40 is generally large such that the developed voltage at the input of buffer amplifier is generally large.

During the recharge portion of the readout pulse, the magnitude of the readout pulse decreases at a slower rate than the discharge portion of the readout pulse such that the recharge portion is associated with a lower frequency tail as the capacitors of the APDs 18 reach their charged state. Since the recharge rate the microcells 16 is generally low compared to the discharge rate, the impedance of the inductor 40 is generally smaller for the recharge portion of the readout pulse as compared to the discharge portion. As a result of this frequency dependency, the inductor 40 substantially affects the recharge portion of the readout pulse by attenuating the recharge portion of the readout signal.

Figure 4:
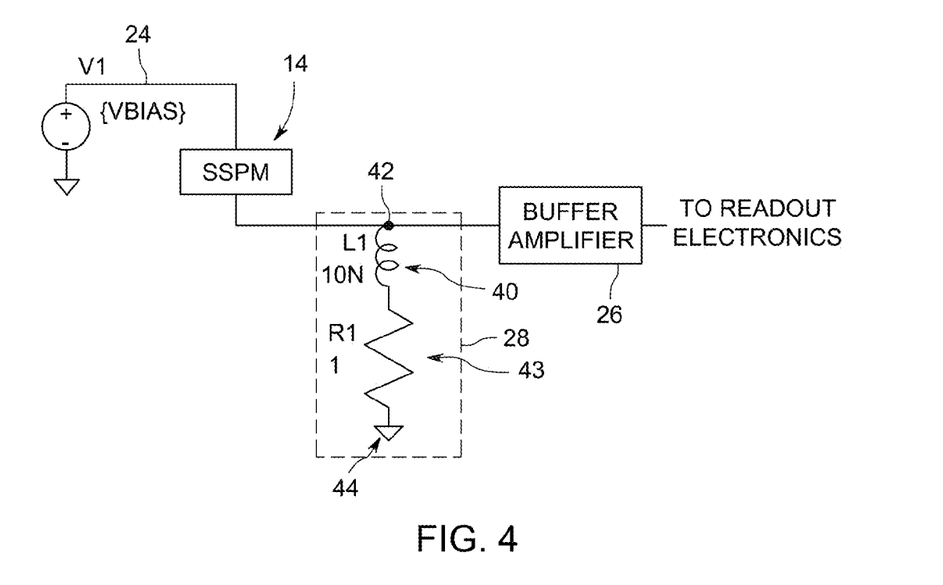
FIG. 4 is a simplified circuit schematic illustrating an exemplary embodiment of an SSPM-based detector in accordance with the present disclosure.
Figure 10:
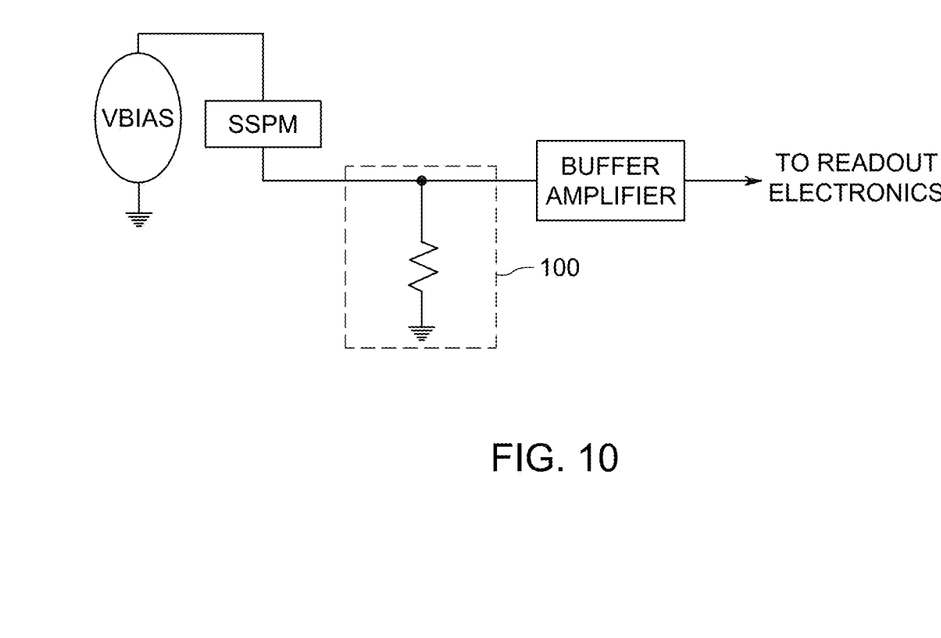
FIG. 10 is a simplified circuit schematic illustrating an SSPM-based detector having a frequency independent input impedance circuit.

By manipulating input impedance in response to a frequency associated with the readout pulse, exemplary embodiments can substantially reduce the long tail portion of associated with a conventional frequency independent input impedance. A conventional frequency independent input impedance circuit 100 is shown in FIG. 10. For the input impedance circuit 28 of the present embodiment, the recharge portion of the output signal received at the input of the buffer amplifier is generally reduce as compared to the recharge portion received at the input of a buffer amplifier using a convention frequency independent input impedance. This ensures that the buffer amplifier 26 generally amplifies the discharge portion of the readout pulse in its native form, but mitigates the recharge portion of the readout pulse. In an exemplary embodiment a resistor 43 can be added to the input impedance circuit 28 in series with the inductor 40, as shown in FIG. 4. The resistor 43 can dampen the frequency response of the inductance 40 to reduce distortions in the readout pulse due to the inductor 40 and to smooth the response of the input impedance circuit 28 for the readout pulse.

Figure 5:
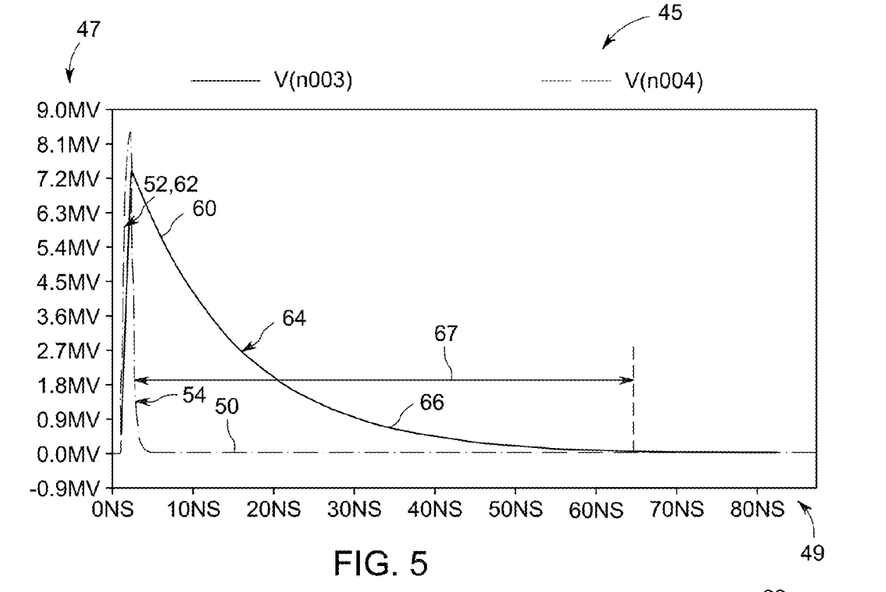
FIG. 5 shows a comparison of exemplary readout pulses of an SSPM-based detector using a convention input impedance arrangement and the input impedance circuit of FIG. 4.

FIG. 5 is a plot 45 showing an exemplary simulated comparison of a readout pulse 50 using the circuit configuration of FIG. 4 with the input impedance circuit 28 and a conventional readout pulse 60 without the input impedance circuit 28. The y-axis 47 represents an amplitude of the readout pulses in millivolts and the x-axis 49 represents time in nanoseconds. As shown in FIG. 5, the readout pulses 50 and 60 have a discharge portion 52 and 62 for which the magnitude of the readout pulse increases and a recharge portion 54 and 64 for which the magnitude of the readout pulse decreases. The inductor 40 and resistor 43 of FIG. 4 generally have little to no effect on the discharge portion 52 of the readout pulse 50, and therefore the discharge portions 52 and 62 are generally equivalent. However, as shown in FIG. 5, the inductor 40 operates to shape the recharge portion 54 of the readout pulse 50 as compared to the recharge portion 64 of the readout pulse 60. The recharge portion 64 has a long tail portion 66 generally attributed to the recharge rate of the microcells in the SSPM. Because the input impedance circuit 28 of the present disclosure provides a low impedance path to ground during the recharge portion of the readout pulse 50, the voltage at the input of the buffer amplifier (i.e., the voltage across the inductor 40) is smaller compared to the voltage at the input of the buffer amplifier using a conventional frequency independent input impedance provided.

Figure 6:
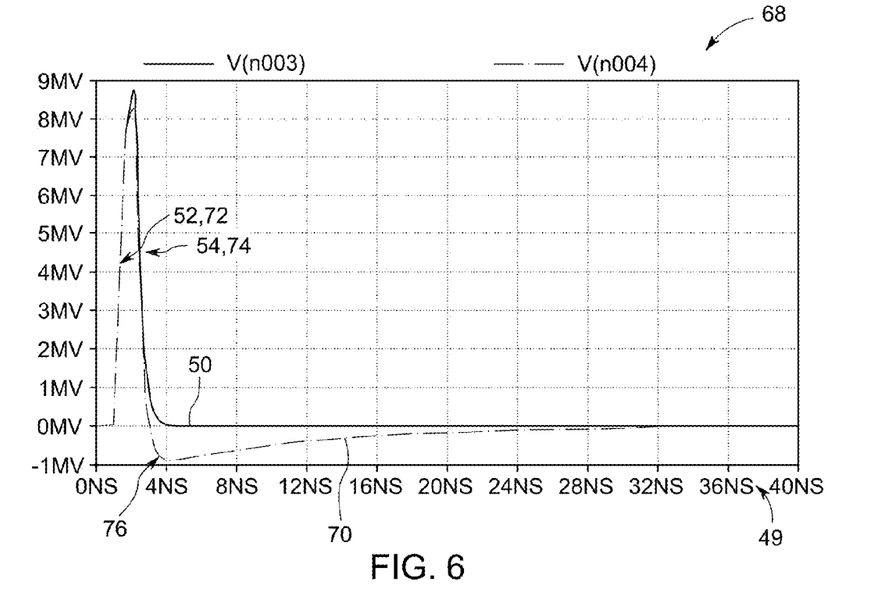
FIG. 6 shows a comparison of exemplary readout pulses of an SSPM-based detector using the input impedance circuit of FIG. 4 and the input impedance circuit of FIG. 3.

FIG. 6 is a plot 68 showing an exemplary simulated comparison of a readout pulse 70 using the circuit configuration of FIG. 3 with the readout pulse 50 using the circuit configuration of FIG. 4. The y-axis 47 represents an amplitude of the readout pulses in millivolts and the x-axis 49 represents time in nanoseconds. The readout pulses 50 and 70 have discharge portions 52 and 72, respectively, for which the magnitude of the readout pulse increases and a recharge portion 54 and 74, respectively, for which the magnitude of the readout pulse decreases. As shown in FIG. 6, when the input impedance circuit 28 does not include the resistor 43, the readout pulse tends to have an overshoot 76, which has a settling time. By introducing the resistor 43 into the input impedance circuit 28, the overshoot can be eliminated or reduced without substantially sacrificing the shaping effect of the inductor 40.

Figure 7:
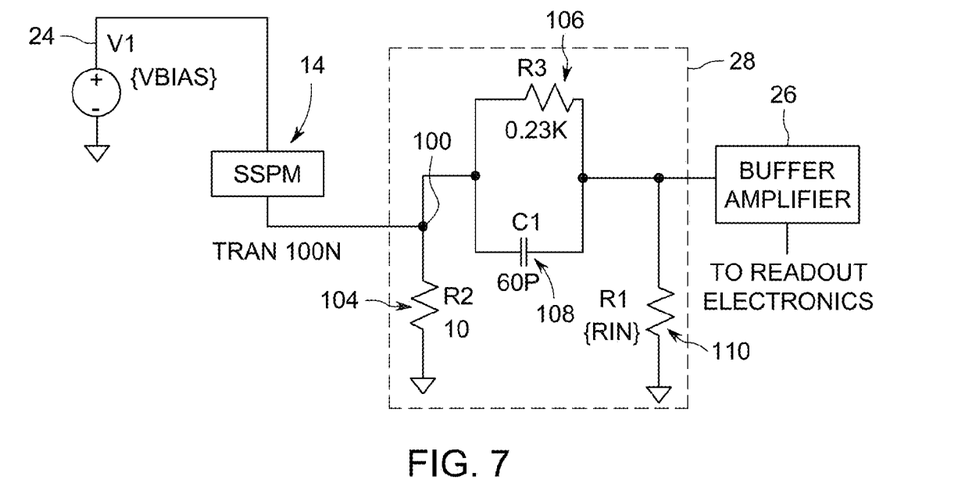
FIG. 7 shows another equivalent circuit for an exemplary embodiment of an SSPM-based detector.

FIG. 7 shows an equivalent circuit for an SSPM-detector including an embodiment of the frequency dependent input impedance circuit 28. The SSPM 14 is modeled as an array of photodiodes with quenching resistors, as described with reference to FIG. 2. As shown in FIG. 7, the frequency dependent input impedance circuit 28 is formed by a pole-zero cancellation circuit connected between the output of the SSPM and the input of the buffer amplifier. While the present embodiment illustrate the impedance circuit 28 as being separate from the buffer amplifier, those skilled in the art will recognize that the input impedance circuit 28 can be part of buffer amplifier 26. The pole-zero cancellation circuit includes a pair of shunt resistors 104 and 110 connected by a parallel combination of a resistor 106 and a capacitor 108. On output of the SSPM is connected to the shunt resistor 104 and the input of the buffer amplifier 26 is connected to the shut resistor 110 such that the output of the SSPM is connected to the input of the buffer amplifier by the parallel combination of the resistor 106 and the capacitor 108.

As the frequency of an electrical signal received by the pole-zero circuit increases, the impedance of the capacitor of the pole-zero circuit generally decreases and the resistor 106 can be bypassed so that the pole-zero circuit can have an effective input impedance at the input of the buffer amplifier, for high frequencies, that can generally be represented by the equivalent resistance of the shunt resistors 104 and 110 in parallel. Likewise and the frequency of an electrical signal received by the pole-zero circuit decreases, the capacitor can have a large impedance such that the input impedance for the buffer amplifier, for low frequencies, can generally be represented as pi circuit formed of resistors 104, 106, and 110, which attenuates the received electrical signal.

Figure 8:
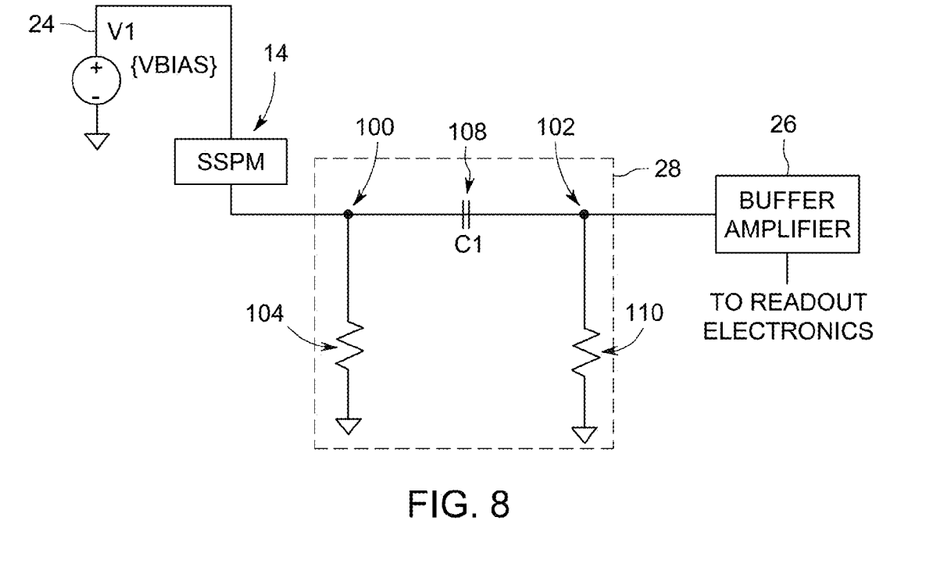
FIG. 8 shows another equivalent circuit for an exemplary embodiment of an SSPM-based detector.

In an exemplary operation, an input impedance for the buffer amplifier can depend on the frequency associated with the readout pulse generated at the output of the SSPM. During the discharge portion of the readout pulse, the contribution of the resistor 106 to the input impedance is reduced due to the capacitor 108 which can have a low effective impedance during the discharge portion of the readout pulse. During the recharge portion of the pulse, the frequency of the readout pulse is generally lower such that the contribution of the resistor to the input impedance is increase; thereby attenuating the voltage of the recharge portion to shape the readout pulse. In an exemplary embodiment the resistor 106 can be removed from the input impedance circuit 28, as shown in FIG. 8. This input impedance circuit is effectively simple CR high band pass filter.

Figure 9:
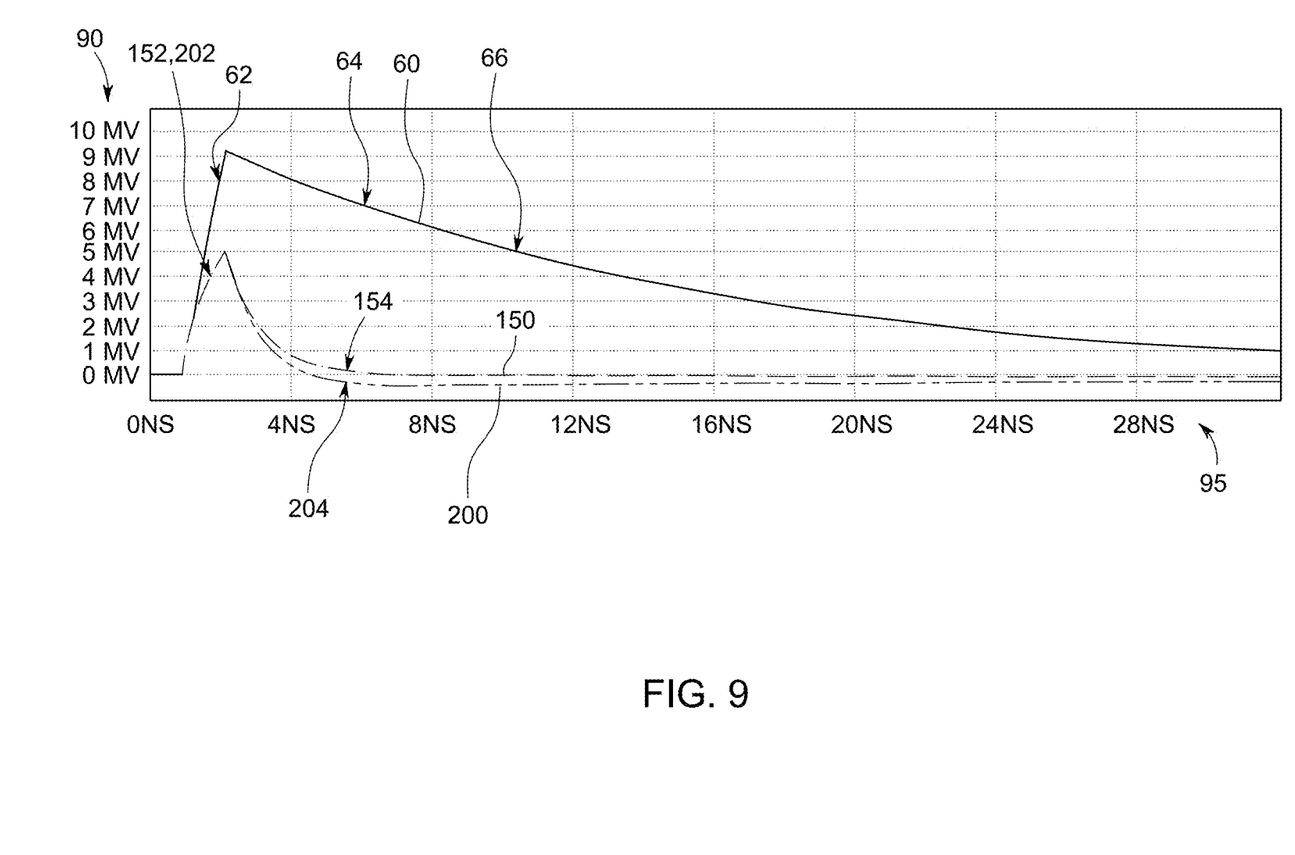
FIG. 9 shows a comparison of exemplary readout pulses of an SSPM-based detector using a conventional input impedance arrangement, the input impedance circuit of FIG. 7, and the input impedance circuit of FIG. 8.

FIG. 9 shows a comparison of exemplary simulated readout pulses 60, 150, and 200 of an SSPM-based detector using a conventional input impedance arrangement, the input impedance circuit of FIG. 7, and the input impedance circuit of FIG. 8, respectively. The y-axis 90 represents an amplitude of the readout pulses in millivolts and the x-axis 95 represents time in nanoseconds. As shown in FIG. 9, readout pulses 60, 150, and 200 have a discharge portion 62, 152, and 202, respectively, for which the magnitude of the readout pulse increases and a recharge portion 64, 154, and 204, respectively, for which the magnitude of the readout pulse decreases. Unlike, the embodiments of the input impedance circuit 28 shown in FIGS. 3 and 4, the pole-zero cancelation circuit of FIG. 7 and high band pass filter circuit of FIG. 8 have a noticeable effect on the peak amplitude of the readout pulse 150 and 200 as well as on the discharge rate of the microcells as compared to the conventional readout pulse 60. However, the pole-zero cancelation circuits of FIG. 7 and high band pass filter circuit of FIG. 8 have a similar effect on the recharge portion of the readout pulses by minimizing the long tail 66 of the conventional readout pulse at the input of the buffer amplifier.

In describing exemplary embodiments, specific terminology is used for the sake of clarity. For purposes of description, each specific term is intended to at least include all technical and functional equivalents that operate in a similar manner to accomplish a similar purpose. Additionally, in some instances where a particular exemplary embodiment includes a plurality of system elements, device components or method steps, those elements, components or steps may be replaced with a single element, component or step. Likewise, a single element, component or step may be replaced with a plurality of elements, components or steps that serve the same purpose. Moreover, while exemplary embodiments have been shown and described with references to particular embodiments thereof, those of ordinary skill in the art will understand that various substitutions and alterations in form and detail may be made therein without departing from the scope of the invention. Further still, other aspects, functions and advantages are also within the scope of the invention.

The invention claimed is:

1. A solid state photomultiplier based detector comprising:
a solid state photomultiplier (SSPM) having a plurality of microcells, the SSPM configured to output a readout pulse in response to photons impinging on one or more of the microcells, the readout pulse having a discharge portion with a discharge rate and a recharge portion with a recharge rate, a magnitude of the readout pulse increasing for the discharge portion and decreasing for the recharge portion;
a buffer amplifier having an input in electrical communication with an output of the SSPM to receive the readout pulse; and
a frequency dependent input impedance circuit in electrical communication with the input of the buffer amplifier to shape the discharge portion of the readout pulse.

2. The detector of claim 1, wherein an impedance of the input impedance circuit is responsive to the discharge rate and the recharge rate of the readout pulse to provide a greater impedance during discharge portion of the readout pulse than the recharge portion of the readout pulse.

3. The detector of claim 2, wherein the recharge rate is substantially unaffected by the frequency dependent input impedance circuit.

4. The detector of claim 2, wherein the impedance of the frequency dependent input impedance circuit decreases with a decrease in frequency in the readout pulse.

5. The detector of claim 2, wherein the frequency dependent input impedance circuit comprises an inductor connected between an output of the SSPM and an input of the buffer amplifier.

6. The detector of claim 5, wherein the frequency dependent input impedance circuit further comprises a resistor connected in series with the inductor.

7. The detector of claim 5, wherein a value of the inductor is specified to shape the recharge portion of the readout pulse so that a recharge time associated with the recharge portion and a discharge time associated with the discharge portion are substantially equivalent.

8. The detector of claim 2, wherein the frequency dependent input impedance circuit comprises a pole-zero cancellation circuit connected between an output of the SSPM and an input of the buffer amplifier.

9. The detector of claim 8, wherein the pole-zero cancellation circuit comprises a capacitor and a resistor connected between an output of the SSPM and an input of the buffer amplifier in parallel to each other.

10. The detector of claim 9, wherein a value of the capacitor and a value of the resistor are specified to shape the recharge portion of the readout pulse so that a recharge time associated with the recharge portion and a discharge time associated with a discharge portion are substantially equivalent.

11. A method of shaping a readout pulse from a solid state photomultiplier (SSPM) comprising:
receiving the readout pulse from the SSPM at an input of a buffer amplifier, the readout pulse having a discharge portion with a discharge rate and a recharge portion with a recharge rate, a magnitude of the readout pulse increasing for the discharge portion and decreasing for the recharge portion; and
employing a frequency dependent input impedance circuit in electrical communication with the input of the buffer amplifier to shape the discharge portion of the readout pulse.

12. The method of claim 11, wherein an impedance of the input impedance circuit is responsive to the discharge rate and the recharge rate of the readout pulse to provide a greater impedance during discharge portion of the readout pulse than the recharge portion of the readout pulse.

13. The method of claim 12, wherein the recharge rate is substantially unaffected by the frequency dependent input impedance circuit.

14. The method of claim 12, wherein the impedance of the frequency dependent input impedance circuit decreases with a decrease in frequency in the readout pulse.

15. The method of claim 12, wherein the frequency dependent input impedance circuit comprises an inductor connected between an output of the SSPM and an input of the buffer amplifier.

16. The method of claim 15, wherein the frequency dependent input impedance circuit further comprises a resistor connected in series with the inductor.

17. The method of claim 15, wherein a value of the inductor is specified to shape the recharge portion of the readout pulse so that a recharge time associated with the recharge portion and a discharge time associated with the discharge portion are substantially equivalent.

18. The method of claim 12, wherein the frequency dependent input impedance circuit comprises a pole-zero cancellation circuit connected between an output of the SSPM and an input of the buffer amplifier.

19. The method of claim 18, wherein the pole-zero cancellation circuit comprises a capacitor and a resistor connected between an output of the SSPM and an input of the buffer amplifier in parallel to each other.

20. The method of claim 19, wherein a value of the capacitor and a value of the resistor are specified to shape the recharge portion of the readout pulse so that a recharge time associated with the recharge portion and a discharge time associated with a discharge portion are substantially equivalent.

* * * * *